(12) United States Patent
Takashima et al.

(10) Patent No.: US 10,121,876 B2
(45) Date of Patent: Nov. 6, 2018

(54) METHOD FOR HIGH TEMPERATURE ANNEALING OF A NITRIDE SEMICONDUCTOR LAYER

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/607,698

(22) Filed: May 30, 2017

(65) Prior Publication Data

US 2018/0019322 A1 Jan. 18, 2018

(30) Foreign Application Priority Data

Jul. 13, 2016 (JP) .................. 2016-138837

(51) Int. Cl.
*H01L 29/66* (2006.01)
*H01L 21/02* (2006.01)
(Continued)

(52) U.S. Cl.
CPC .... *H01L 29/66666* (2013.01); *H01L 21/0217* (2013.01); *H01L 21/0228* (2013.01);
(Continued)

(58) Field of Classification Search
None
See application file for complete search history.

(56) References Cited

U.S. PATENT DOCUMENTS 9,754,783 B2 * 9/2017 Takashima .......... H01L 21/0254
2005/0093155 A1 * 5/2005 Kahlert ............. H01L 21/76843
257/751
(Continued)

FOREIGN PATENT DOCUMENTS

| JP | 2540791 B2 | 7/1993 |
|---|---|---|
| JP | H08-186332 A | 7/1996 |
| JP | 2013-149979 A | 8/2013 |

OTHER PUBLICATIONS

J.C.Zolper et al., "Sputtered AlN encapsulant for high-temperature annealing of GaN", Applied Physics Letters, vol. 69, Issue 4, 538, Jul. 22, 1996.
(Continued)

*Primary Examiner* — Lex Malsawma

(57) ABSTRACT

In case of performing annealing at a temperature of 1300° C. or higher, it is not possible to sufficiently suppress escape of nitrogen from a GaN layer even if a cap layer is provided thereon. Thereby, the front surface of the GaN layer is roughened. A semiconductor device manufacturing method of manufacturing a semiconductor device having a nitride semiconductor layer is provided. The semiconductor device manufacturing method includes: implanting, into a predetermined region of the nitride semiconductor layer, n-type or p-type impurities relative to the nitride semiconductor layer; forming, by atomic layer deposition, a first protective film containing a nitride on and in direct contact with at least the predetermined region; and annealing the nitride semiconductor layer and the first protective film at a temperature of 1300° C. or higher.

13 Claims, 17 Drawing Sheets

(51) Int. Cl.
*H01L 21/265* (2006.01)
*H01L 29/423* (2006.01)
*H01L 29/20* (2006.01)
*H01L 29/78* (2006.01)

(52) U.S. Cl.
CPC .... *H01L 21/0254* (2013.01); *H01L 21/02178* (2013.01); *H01L 21/26546* (2013.01); *H01L 29/2003* (2013.01); *H01L 29/4236* (2013.01); *H01L 29/7827* (2013.01)

(56) References Cited

U.S. PATENT DOCUMENTS

| | | | | |
|---|---|---|---|---|
| 2008/0258133 | A1* | 10/2008 | Seong | H01L 33/04 257/14 |
| 2010/0133656 | A1* | 6/2010 | Hager, IV | H01L 21/324 257/615 |
| 2011/0244617 | A1* | 10/2011 | Su | C23C 16/301 438/46 |
| 2012/0068188 | A1* | 3/2012 | Feigelson | H01L 21/26546 257/76 |
| 2013/0056793 | A1* | 3/2013 | Srinivasan | H01L 21/0237 257/183 |
| 2013/0181240 | A1* | 7/2013 | Chen | H01L 33/005 257/94 |
| 2014/0264454 | A1* | 9/2014 | Banerjee | H01L 29/7786 257/194 |
| 2015/0380238 | A1* | 12/2015 | Takashima | C23C 16/56 257/76 |
| 2015/0380498 | A1* | 12/2015 | Tanaka | H01L 29/7802 257/76 |
| 2016/0155629 | A1* | 6/2016 | Hawryluk | H01L 21/268 438/509 |

OTHER PUBLICATIONS

X.A.Cao et al., "Ultrahigh Si+ implant activation efficiency in GaN using a high-temperature rapid thermal process system", Applied Physics Letters, vol. 73, Issue 2, 229, Jul. 13, 1998.

C.E.Hager IV et al., "Activation of ion implanted Si in GaN using a dual AlN annealing cap", Journal of Applied Physics, vol. 105, Issue 3, 033713, Feb. 2009.

* cited by examiner

METHOD FOR HIGH TEMPERATURE ANNEALING OF A NITRIDE SEMICONDUCTOR LAYER

The contents of the following Japanese patent application are incorporated herein by reference:
NO. 2016-138837 filed on Jul. 13, 2016.

BACKGROUND

1. Technical Field

The present invention relates to a semiconductor device manufacturing method.

Conventionally, annealing is performed after providing a cap layer on a gallium nitride (hereinafter, referred to as GaN) layer (please see, for example, Patent Documents 1 and 2, and Non-Patent Documents 1, 2 and 3). Also, it has conventionally been known to form a nitride buffer layer by a plasma-assisted atomic layer deposition process (please see, for example, Patent Document 3).

PRIOR ART TECHNICAL DOCUMENTS

Patent Documents

[Patent Document 1] Japanese Patent Application Publication No. H08-186332
[Patent Document 2] Japanese Patent No. 2540791
[Patent Document 3] Japanese Patent Application Publication No. 2013-149979

Non-Patent Documents

[Non-Patent Document 1] J. C. Zolper et al., "Sputtered AlN encapsulant for high-temperature annealing of GaN", Applied Physics Letters, Volume 69, Issue 4, 538, 22 Jul. 1996
[Non-Patent Document 2] X. A. Cao et al., "Ultrahigh $Si^+$ implant activation efficiency in GaN using a high-temperature rapid thermal process system", Applied Physics Letters, Volume 73, Issue 2, 229, 13 Jul. 1998
[Non-Patent Document 3] C. E. Hager IV et al., "Activation of ion implanted Si in GaN using a dual AlN annealing cap", Journal of Applied Physics, Volume 105, Issue 3, 033713, February 2009

In case of performing annealing at a temperature of 1300° C. or higher, it is not possible to sufficiently suppress escape of nitrogen from a GaN layer even if a cap layer is provided thereon. Thereby, the front surface of the GaN layer is roughened.

SUMMARY

According to a first aspect of the present invention, a semiconductor device manufacturing method of manufacturing a semiconductor device having a nitride semiconductor layer is provided. The semiconductor device manufacturing method includes: implanting, into a predetermined region of the nitride semiconductor layer, n-type or p-type impurities relative to the nitride semiconductor layer; forming, by atomic layer deposition, a first protective film; and annealing the nitride semiconductor layer and the first protective film at a temperature of 1300° C. or higher. The first protective film may be on and in direct contact with at least the predetermined region. The first protective film may contain a nitride.

The forming the first protective film by the atomic layer deposition may have forming the first protective film by supplying, onto the nitride semiconductor layer, an aluminium atom-containing gas or a silicon atom-containing gas and a nitrogen atom-containing gas alternately. The first protective film may have an aluminium nitride or a silicon nitride.

In the forming the first protective film by the atomic layer deposition, a temperature of the nitride semiconductor layer may be 600° C. or lower.

In the forming the first protective film by the atomic layer deposition, a temperature of the nitride semiconductor layer may be 300° C. or higher.

The first protective film may have a thickness of 2 nm or larger and 100 nm or smaller.

The forming the first protective film by the atomic layer deposition may have: (a) supplying trimethylaluminium onto the nitride semiconductor layer; (b) evacuating a reaction chamber in which the nitride semiconductor layer is placed; (c) irradiating the nitride semiconductor layer with plasma of a nitrogen-containing gas; and (d) evacuating the reaction chamber, and one cycle including (a) to (d) may be repeated multiple times to form the first protective film.

The semiconductor device manufacturing method may further include, after the forming the first protective film by the atomic layer deposition and before the annealing, forming a second protective film by a method different from the atomic layer deposition. The second protective film may be on and in direct contact with the first protective film. The second protective film may be thicker than the first protective film.

The nitride semiconductor layer may have a trench to which a gate insulating film and a gate electrode are provided. The first protective film may be provided coating a bottom portion and a side portion of the trench.

The implanting may have implanting the p-type impurities into the predetermined region after the forming the first protective film by the atomic layer deposition.

The implanting may have implanting n-type impurities relative to the nitride semiconductor layer into another predetermined region of the nitride semiconductor layer before the implanting the p-type impurities into the predetermined region. The semiconductor device manufacturing method may further comprise, before the implanting the n-type impurities, forming a third protective film that is on and in direct contact with the other predetermined region and contains one or more types among silicon and oxygen. The first protective film may be formed by the atomic layer deposition after removing the third protective film.

According to a second aspect of the present invention, another semiconductor device manufacturing method of manufacturing a semiconductor device having a nitride semiconductor layer is provided. The other semiconductor device manufacturing method may include: implanting, into a predetermined region of the nitride semiconductor layer, n-type or p-type impurities relative to the nitride semiconductor layer; forming, by a first method, a first protective film; forming a second protective film by a second method different from the first method; and annealing the nitride semiconductor layer, the first protective film and the second protective film at a temperature of 1300° C. or higher. The first protective film may be on and in direct contact with at least the predetermined region. The first protective film may contain a nitride. The second protective film may be on and in direct contact with the first protective film.

The summary clause does not necessarily describe all necessary features of the embodiments of the present invention. The present invention may also be a sub-combination of the features described above.

BEST MODE FOR CARRYING OUT THE INVENTION

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
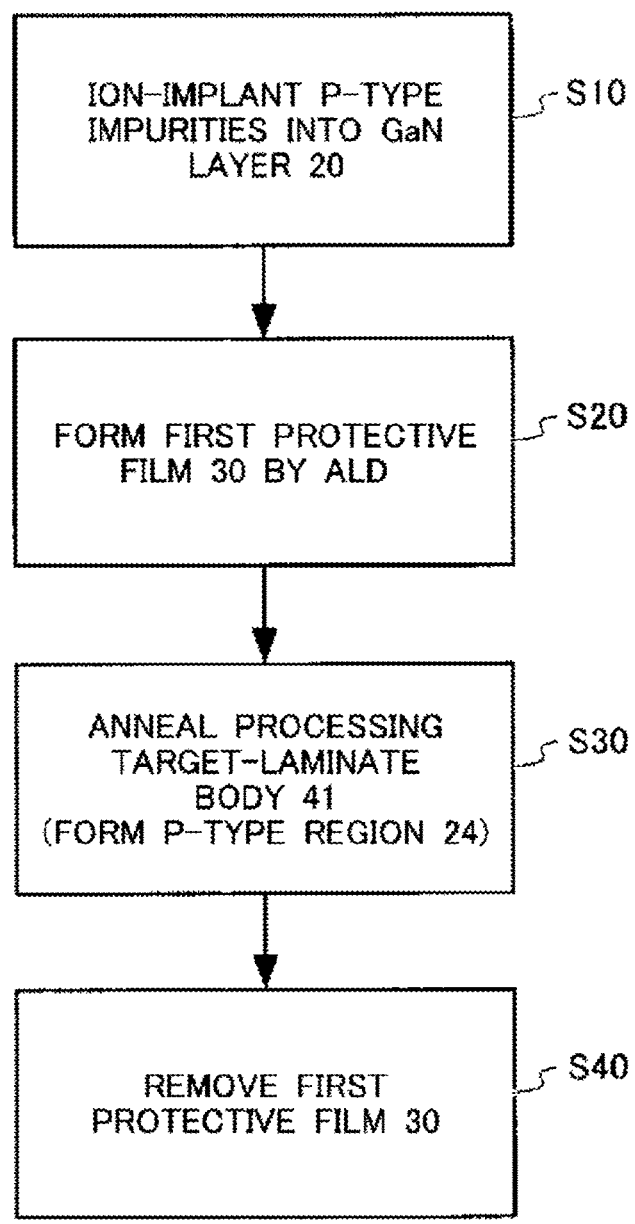
FIG. 1 is a figure showing a manufacturing method 100 to form a p-type region 24 in a GaN layer 20 according to a first embodiment.

FIG. 1 is a figure showing a manufacturing method 100 to form a p-type region 24 in a GaN layer 20 according to a first embodiment. The GaN layer 20 as a nitride semiconductor layer may be used in a semiconductor device such as a MOSFET (Metal-Oxide-Semiconductor Field-Effect Transistor), an IGBT (Insulated Gate Bipolar Transistor) or a diode.

The manufacturing method 100 in the present example includes a step of implanting p-type impurities into the GaN layer 20 (S10), a step of forming a first protective film 30 by atomic layer deposition (hereinafter, abbreviated to ALD) (S20), a step of annealing a processing target-laminate body 41 having the GaN layer 20 and the first protective film 30 (S30), and a step of removing the first protective film 30 (S40). In the present example, the respective steps are executed in the order of S10 to S40.

In the present specification, only GaN is explained as an example of a nitride semiconductor. However, a nitride semiconductor layer may further include one or more elements among aluminium (Al) and indium (In). That is, the nitride semiconductor may be a mixed crystal semiconductor $Al_xIn_yGa_{1-x-y}N$ ($0 \leq x < 1$, $0 \leq y < 1$).

Figure 2:
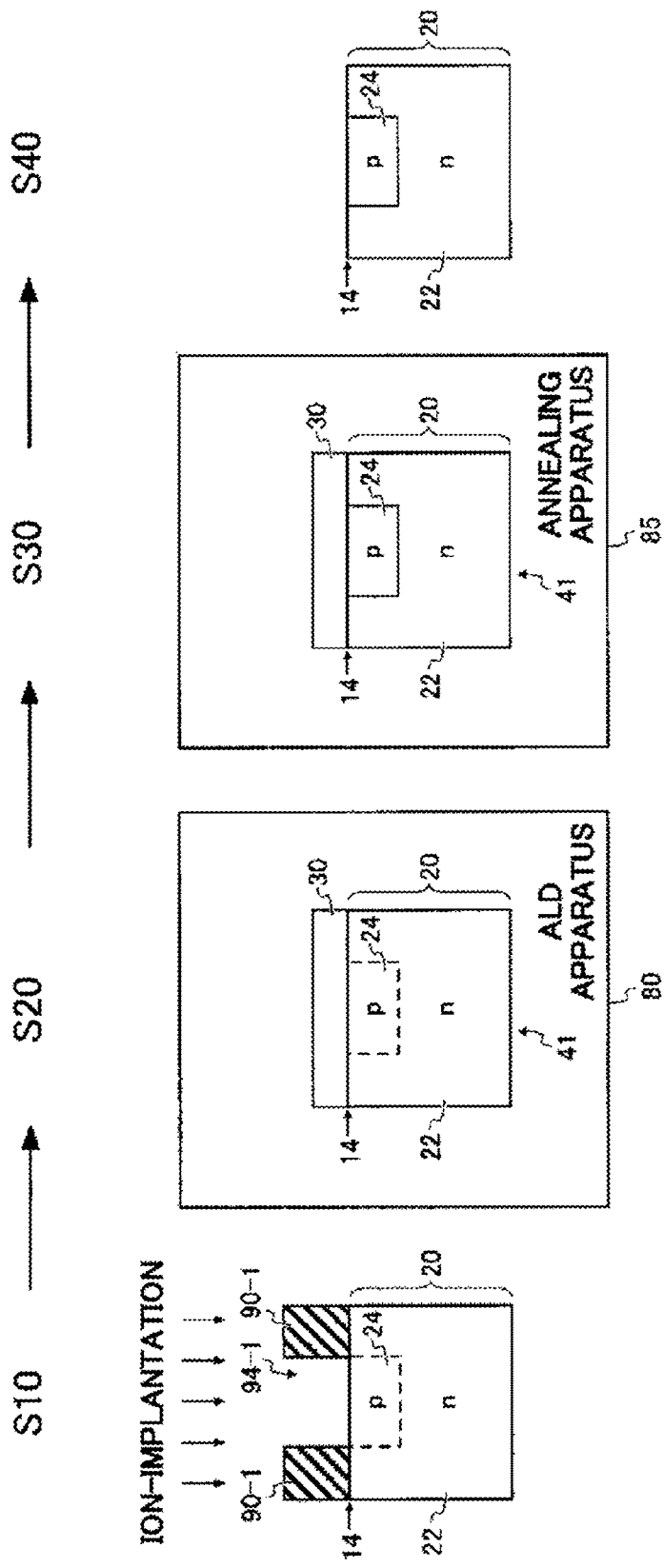
FIG. 2 is a figure showing S10 to S40 corresponding to respective steps of the manufacturing method 100.

FIG. 2 is a figure showing S10 to S40 corresponding to the respective steps of the manufacturing method 100. At S10, p-type impurities are ion-implanted into an n-type region 22 of the n-type GaN layer 20 through a mask 90-1. Specifically, Mg is ion-implanted into a predetermined region corresponding to the shape of an opening 94-1 of the mask 90-1. The p-type region 24 is, at its uppermost part, exposed to a front surface 14 of the GaN layer 20, and has a predetermined depth range from the front surface 14. The p-type region 24 is a region where holes become majority carriers after annealing is performed at S30. Sufficient p-type properties does not manifest itself at S10 and S20, but the p-type region 24 is indicated with dotted lines to indicate that it is a region into which p-type impurities have been implanted. The n-type region 22 is a region where electrons are majority carriers.

Although in the present example, an example in which p-type impurities are ion-implanted is explained, in another example, n-type impurities may be ion-implanted into a predetermined region of the GaN layer 20. In this case also, the step of ALD-forming the first protective film 30 (S20) and the step of annealing the processing target-laminate body 41 (S30) in the present example may be applied.

The p-type impurities in the present example are p-type impurities relative to GaN. The p-type impurities relative to GaN may be one or more types of element among Mg (magnesium), Ca (calcium), Be (beryllium), and Zn (zinc). In the present example, Mg is used as the p-type impurities. Also, the n-type impurities in the present example are n-type impurities relative to GaN. The n-type impurities relative to GaN may be one or more types of element among Si (silicon), Ge (germanium) and O (oxygen). In the present example, Si is used as the n-type impurities.

The material of the mask 90 may be silicon dioxide ($SiO_2$) that is selectively removable from the GaN layer 20, or a photoresist used in photolithography processes. The opening 94 of the mask 90 can be formed by known photolithography processes.

At S20, the GaN layer 20 is placed in a reaction chamber of an ALD apparatus 80. Thereafter, the first protective film 30 is formed on and in direct contact with at least the p-type region 24 by ALD. In the present example, the first protective film 30 to directly contact the entire surface of the front surface 14 is formed. Thereby, the processing target-laminate body 41 having the first protective film 30 and the GaN layer 20 is formed.

The first protective film 30 has the function of suppressing decomposition and release of nitrogen atoms from the GaN layer 20. As explained in experimental examples below, the inventors of the present invention found out that roughening of the front surface 14 during annealing is more likely to be generated as the degree of adhesion between the first protective film 30 and the front surface 14 decreases. This is assumed to result from a fact that the lower the degree of adhesion between the first protective film 30 and the front surface 14, the less the protective film functions as a protective film to suppress release of nitrogen atoms.

Nitrogen vacancies of the GaN layer 20 which have been formed due to nitrogen atoms being released function as donor-type defects (that is, voids that function as donors). The donor-type defects not only negatively affect the electrical properties of a semiconductor device, but also compensate for holes. Therefore, in order to reduce nitrogen vacancies, making the front surface 14 less roughened by increasing the degree of adhesion between the first protective film 30 and the front surface 14 is important for sufficient p-type properties to manifest themselves.

In the present example, because the first protective film 30 is formed by ALD, as compared with sputtering (hereinafter, abbreviated to SPT) or metal organic chemical vapor deposition (hereinafter, abbreviated to MOCVD), it is possible to improve the degree of adhesion at the interface between the first protective film 30 and the front surface 14 at the time of forming the first protective film 30. Furthermore, by forming the first protective film 30 by ALD, a good degree of adhesion with fewer gaps at the interface can be maintained also at the subsequent annealing step (S30).

At S30, the processing target-laminate body 41 is annealed in an annealing apparatus 85 at a temperature of 1300° C. or higher. In the present example, the processing target-laminate body 41 is annealed at 1400° C. and for 30 seconds. Thereby, defects that have been generated due to the ion implantation can be repaired, and the p-type impurities can be activated to function as holes. Therefore, at S30 and the following steps, the p-type region 24 is indicated with solid lines.

At S40, the first protective film 30 is removed. In the present example, the entire first protective film 30 provided on the GaN layer 20 is removed selectively from the GaN layer 20 by etching. Thereby, the GaN layer 20 having the p-type region 24 is completed.

Figure 3:
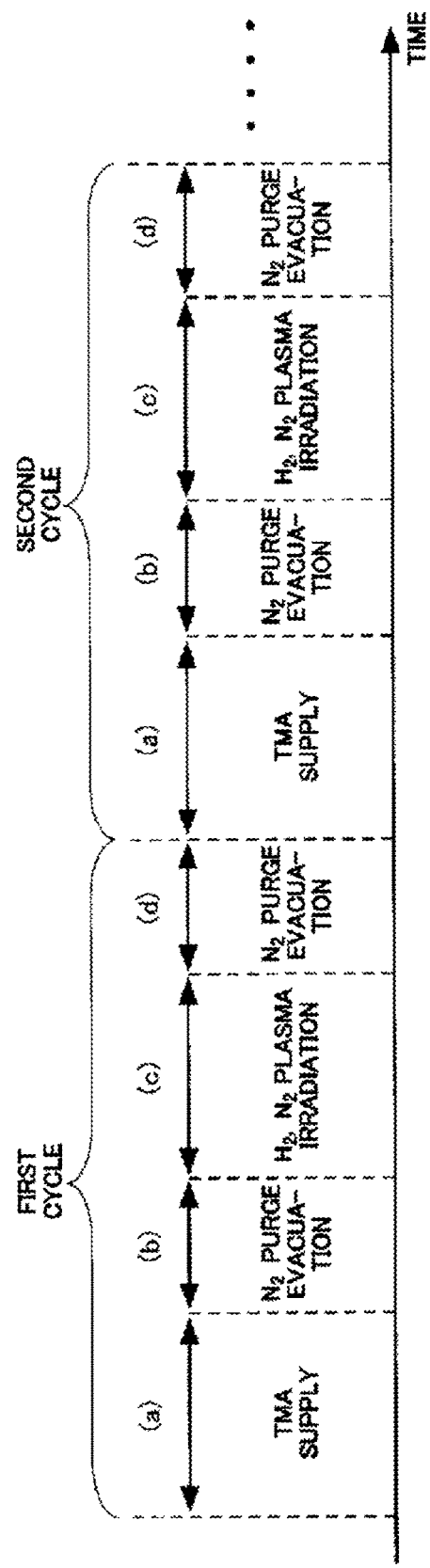
FIG. 3 is a figure for explaining atomic layer deposition at S20.

FIG. 3 is a figure for explaining atomic layer deposition at S20. The first protective film 30 may be a nitride. That is, the first protective film 30 may be an aluminium nitride (hereinafter, abbreviated to AlN or a silicon nitride (hereinafter, abbreviated to $Si_3N_4$). AlN may not have a ratio between Al atoms and N atoms of precisely 1:1. Also, $Si_3N_4$ may not have a ratio between Si atoms and N atoms of precisely 3:4. In other words, variations in the composition ratios of AlN and $Si_3N_4$ are permitted.

In the present example, in order to form AlN as the first protective film 30, the GaN layer 20 is placed in the reaction chamber of the ALD apparatus 80, and an aluminium atom-containing gas and a nitrogen atom-containing gas are supplied alternately onto the GaN layer 20. In this respect, ALD is different from MOCVD and molecular beam epitaxy (hereinafter, abbreviated to MBE) that supply material gases all at once onto the GaN layer 20, and the first protective film 30 can be formed layer-by-layer. Accordingly, a film can be formed at a high degree of adhesion with the front surface 14 of the GaN layer 20.

The aluminium atom-containing gas in the present example is trimethylaluminium (hereinafter, abbreviated to TMA). However, the aluminium atom-containing gas may be alkylaluminium such as triethylaluminium. Also, the nitrogen atom-containing gas in the present example is a gas containing hydrogen ($H_2$) and nitrogen ($N_2$). However, the nitrogen atom-containing gas may be ammonia ($NH_3$).

In the step of forming AlN by ALD, one cycle including the following Step (a) to Step (d) may be repeated multiple times. In the present example, the cycle is repeated 200 to 800 times. Step (a): TMA is supplied onto the GaN layer 20; Step (b): the reaction chamber in which the GaN layer 20 is placed is evacuated; Step (c): the GaN layer 20 is irradiated with plasma of a nitrogen-containing gas; and Step (d): the reaction chamber is evacuated.

At Step (a) in the present example, a TMA gas is supplied into the reaction chamber at a pressure of 15 mTorr. Thereby, TMA molecules are chemisorbed by the front surface 14 of the GaN layer 20.

At Step (b) in the present example, the TMA gas not absorbed by the front surface 14 but staying within the reaction chamber is purged by filling the reaction chamber with an inactive nitrogen gas ($N_2$ gas). Also, evacuation of the reaction chamber at the same time with the purging or after the purging, un-chemisorbed TMA molecules are expelled from the reaction chamber. The reaction chamber after the evacuation has a pressure of 10 mTorr.

At Step (c) in the present example, the front surface 14 of the GaN layer 20 is irradiated with plasma of a hydrogen and nitrogen-containing gas. Hydrogen its plasma state may be used to split bonds between Al and methyl groups in TMA. Also, nitrogen its plasma state may react with Al to form bonds between Al and N. Thereby, an AlN monoatomic layer can be formed.

At Step (d) in the present example, in a similar manner to Step (b), hydrogen and nitrogen in the reaction chamber are purged by filling it with a nitrogen gas. Also, evacuation of the reaction chamber at the same time with the purging or after the purging makes the pressure of the reaction chamber 15 mTorr. Thereby, a first cycle ends. Subsequently, Step (a) in a second cycle is executed.

In another example in which the $Si_3N_4$ is formed as the first protective film 30 by ALD, a silicon atom-containing gas and a nitrogen atom-containing gas are supplied alternately onto the GaN layer 20. In this case, at Step (a), instead of TMA, tris(dimethylamino)silane containing Si is supplied. Step (b) to Step (d) may be the same as those in the example of AlN.

The GaN layer 20 placed within the reaction chamber may be heated so as to attain a predetermined temperature during Steps (a) to (d). The predetermined temperature of the GaN layer 20 may be 600° C. or lower. A temperature of the GaN layer 20 higher than 600° C. causes the GaN layer 20 itself to start being decomposed. By making the temperature of the GaN layer 20 600° C. or lower, decomposition of the GaN layer 20 can be suppressed.

The GaN layer 20 may be heated so as to attain a predetermined temperature of 300° C. or higher. By forming the first protective film 30 at a temperature of 300° C. or higher, the amount of oxygen remaining within the reaction chamber that is to be taken into the first protective film 30 can be reduced.

The predetermined temperature of the GaN layer 20 may be: 300° C. or higher and 600° C. or lower, 400° C. or higher and 600° C. or lower, or 500° C. or higher and 600° C. or lower; 300° C. or higher and 500° C. or lower, or 300° C. or higher and 400° C. or lower; or 400° C. or higher and 500° C. or lower, or 530° C. or higher and 570° C. or lower. In the present example, the temperature of the GaN layer 20 is 550° C.

The first protective film 30 desirably: is so heat-resistant that it can withstand annealing temperature; has a good degree of adhesion to the GaN layer 20 at a thermal process; and does not allow diffusion of impurities from the first protective film 30 to the GaN layer 20. Furthermore, because the first protective film 30 is removed after annealing, desirably the first protective film 30 can be etched selectively from the underlying GaN layer 20.

Because in the present example, the amount of oxygen to be taken into the first protective film 30 is reduced as explained above, diffusion of n-type impurities from the first protective film 30 to the GaN layer 20 in the subsequent annealing step can be reduced. In terms of reduction of diffusion of n-type impurities from the first protective film 30, AlN is more desirable as the first protective film 30 than $Si_3N_4$ having Si as n-type impurities.

The first protective film 30 in the present example has a thickness of 2 nm or larger and 100 nm or smaller. The lower limit value of thickness may be a minimum thickness that allows reduction of damages to the GaN layer 20 at the time of forming further a second protective film 32 on the first protective film 30 explained below. In terms of this, the lower limit of the thickness 30 of the first protective film 30 may be 5 nm, 10 nm or 15 nm.

The upper limit of thickness of the first protective film 30 may be a thickness corresponding to the length of time permitted for formation of the p-type region 24 or a semiconductor device having it. Because in the present example, the first protective film 30 is formed by ALD layer-by-layer, the deposition rate is lower than those in SPT, MOCVD and MBE. For example, formation of 100-nm AlN by ALD with the temperature of the GaN layer 20 at 550° C. takes time which is as long as six hours or longer. Therefore, the length of time during which the first protective film 30 is manufactured (in other words, the thickness of the first protective film 30) may be determined considering the length of time permitted in a semiconductor device manufacturing method.

At S40, the first protective film 30 is removed. If the first protective film 30 is AlN, AlN can be removed selectively from the GaN layer 20 using a potassium hydroxide solution (KOHaq). Also, if the first protective film 30 is $Si_3N_4$, $Si_3N_4$ can be removed selectively from the GaN layer 20 using a phosphoric acid solution ($H_3PO_4$aq).

Figure 4A:
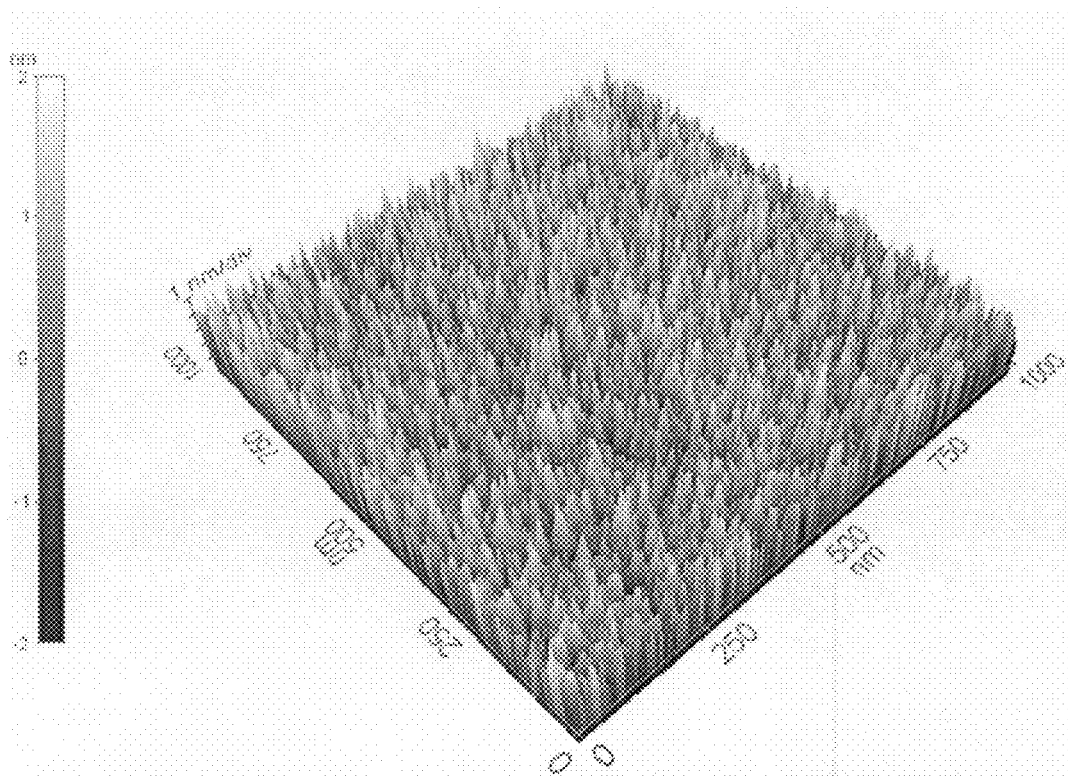
FIG. 4A is a three-dimensional stereographic figure showing an MOCVD-AlN film in a first experimental example.

FIG. 4A is a three-dimensional stereographic figure showing an MOCVD-AlN film in a first experimental example. FIG. 4A is a top perspective view of a 1000-nm square MOCVD-AlN film at the time of MOCVD-AlN film formation (as-deposited). In the present specification, an MOCVD-AlN film means an AlN film formed by MOCVD.

In the present example, the temperature of the GaN layer 20 is 600° C., and the pressure in the reaction chamber is 200 Torr. Also, TMA, ammonia ($NH_3$), hydrogen ($H_2$) and nitrogen ($N_2$) were respectively supplied into the reaction chamber. Under these conditions, an AlN film was formed for 10 minutes to have a thickness of 18 nm.

Figure 4B:
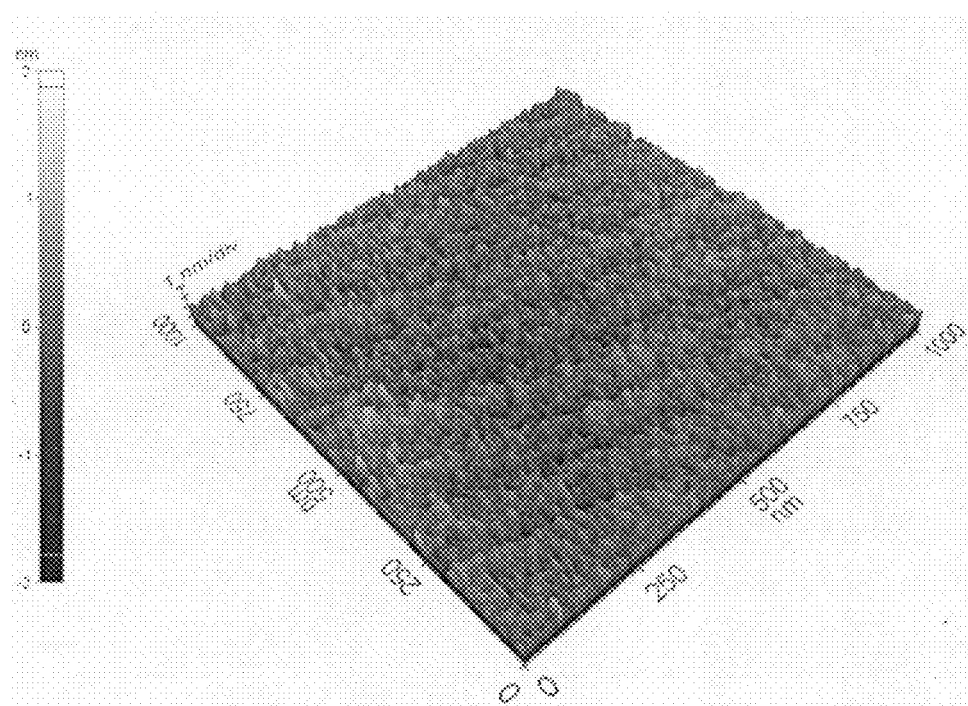
FIG. 4B is a three-dimensional stereographic figure showing an ALD-AlN film in a second experimental example.

FIG. 4B is a three-dimensional stereographic figure showing an ALD-AlN film in a second experimental example. FIG. 4B is a top perspective view of a 1000-nm square ALD-AlN film at the time of ALD-AlN film formation (as-deposited). In the present specification, an ALD-AlN film means an AlN film formed by ALD.

In the present example, an AlN film was formed by the above-mentioned manufacturing method 100. Thereby, an AlN film having a thickness of 18 nm was formed.

As is obvious from comparison between FIG. 4A and FIG. 4B, the ALD-AlN film in FIG. 4B has a lower degree of unevenness as compared with the MOCVD-AlN film. That is, the ALD-AlN film is flatter than the MOCVD-AlN film. It can be said that because the thicknesses of both the ALD-AlN film and the MOCVD-AlN film are 18 nm, the flat ALD-AlN film has a larger area at which it contacts the GaN layer 20 than the MOCVD-AlN film does. That is, the ALD-AlN film has a higher degree of adhesion with the front surface 14 of the GaN layer 20 than that of the MOCVD-AlN film. As a result, it can be said that the ALD-AlN film having a higher degree of adhesion excels the MOCVD-AlN film in functioning as a protective film to suppress release of nitrogen atoms.

Figure 5:
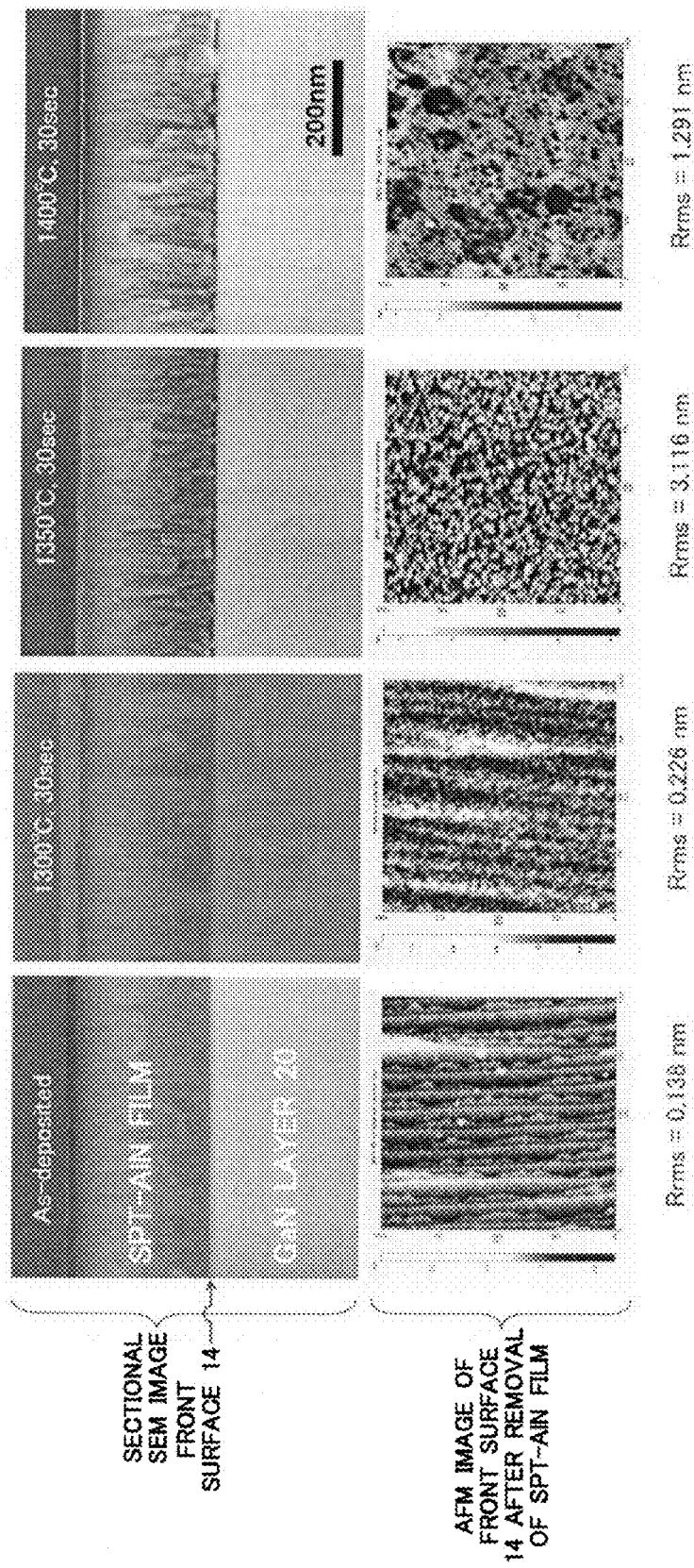
FIG. 5 is a figure showing annealing temperature dependence of an SPT-AlN film in a third experimental example.

FIG. 5 is a figure showing annealing temperature dependence of an SPT-AlN film in a third experimental example. In the present specification, an SPT-AlN film means an AlN film formed by SPT. Four upper images in FIG. 5 are SEM (scanning electron microscope) images showing cross sections of SPT-AlN films as the first protective film 30 and the GaN layer 20. In contrast to this, four lower images are AFM (atomic force microscope) images showing the front surface 14 of the GaN layer 20 after the corresponding upper SPT-AlN films are removed.

The leftmost SEM image and AFM image are images captured before annealing is performed (in other words, at the time of SPT-AlN film formation (as-deposited). The SEM image and AFM image to the right are images captured after annealing is performed at 1300° C. and for 30 seconds. The SEM image and the AFM image to the left of the rightmost images are images captured after annealing is performed at 1350° C. and for 30 seconds. The rightmost SEM image and AFM image are images captured after annealing is performed at 1400° C. and for 30 seconds.

As can be visually recognized from the SEM images corresponding to the annealing temperatures of 1350° C. and 1400° C., the crystallization of the SPT-AlN film becomes noticeable if the annealing temperature is 1350° C. or higher. In particular, crystal grains in the SPT-AlN film grow into columnar shapes in a direction parallel with a direction from the GaN layer 20 to the SPT-AlN film.

It can be visually recognized that due to the crystal grains growing into columnar shapes, voids are generated between the front surface 14 of the GaN layer 20 and the SPT-AlN film. In this manner, if the first protective film 30 is formed by SPT, a good degree of adhesion between the first protective film 30 and the GaN layer 20 cannot be maintained due to voids formed at the time of annealing.

The roughness (Rrms) of the front surface 14 in each AFM image is indicated with the root mean square of a height distribution obtained from a 1000-nm square AFM image. The "as-deposited" Rrms was 0.138 nm. The "annealing temperature 1300° C." Rrms was 0.226 nm. In contrast to this, if the annealing temperature was 1350° C., Rrms increased considerably to 3.116 nm due to generation of gaps between the first protective film 30 and the front surface 14. If the annealing temperature was 1400° C., Rrms decreased as compared with that if the annealing temperature was 1350° C., but still was 1.291 nm. It can be assumed that Rrms decreased if the annealing temperature was 1400° C. as compared with that if the annealing temperature was 1350° C. because the uneven structure was etched due to decomposition being more facilitated at a high temperature.

Figure 6:
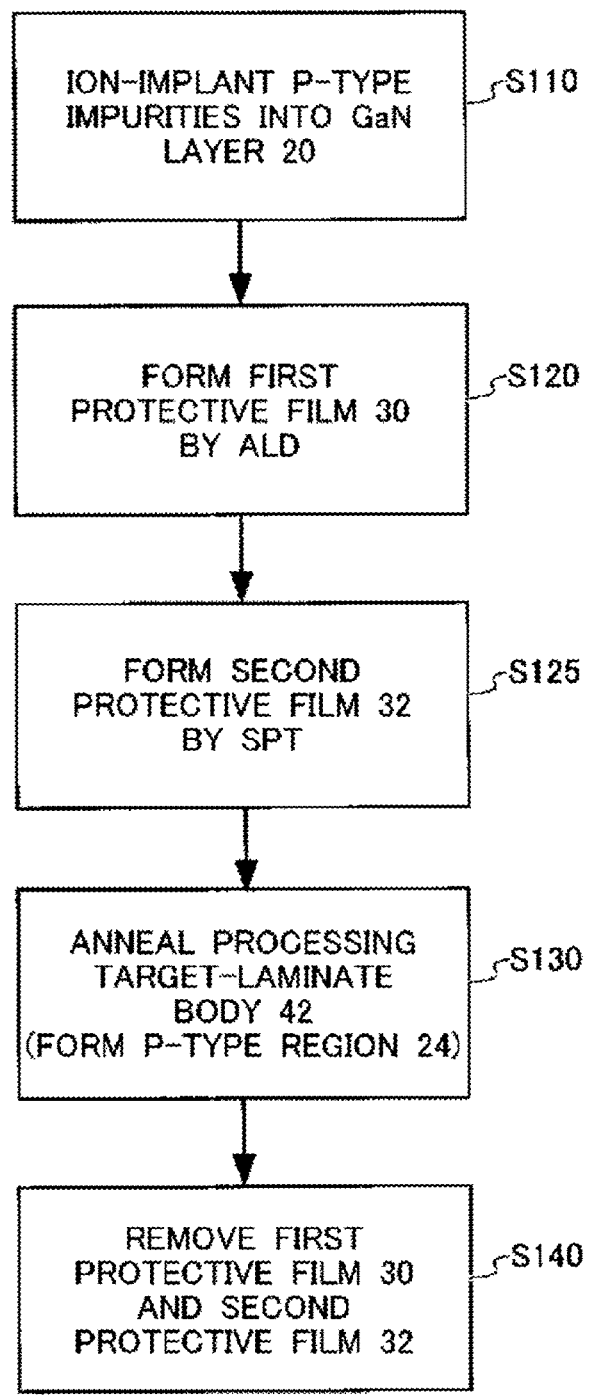
FIG. 6 is a figure showing a manufacturing method 200 to form the p-type region 24 in the GaN layer 20 according to a second embodiment.

FIG. 6 is a figure showing a manufacturing method 200 to form the p-type region 24 in the GaN layer 20 according to a second embodiment. The manufacturing method 200 in the present example includes a step of implanting p-type impurities into the GaN layer 20 (S110), a step of forming the first protective film 30 by ALD (S120), a step of forming the second protective film 32 (S125), a step of annealing a processing target-laminate body 42 having the GaN layer 20, the first protective film 30 and the second protective film 32 at a temperature of 1300° C. or higher (S130), and a step of removing the first protective film 30 and the second protective film 32 (S140). In the present example, the respective steps are executed in the order of S110 to S140.

The second protective film 32 may be provided on and in direct contact with the first protective film 30 by a method different from a first method of forming the first protective film 30. In the present example, the first method is ALD, and the second method is SPT.

In the present example, the first protective film 30 is an ALD-AlN film, and the second protective film 32 is an SPT-AlN film. However, the first protective film 30 and the second protective film 32 may be materials that are different from each other. That is, elements constituting them may be different. If the first protective film 30 is an ALD-AlN film, the second protective film 32 may be a silicon nitride film deposited by SPT.

The second protective film 32 only has to have a coefficient of thermal expansion a that is the approximately same as that of the first protective film 30, and be heat resistant to the approximately same degree as the first protective film 30. The approximately same coefficients of thermal expansion may mean that the difference in the coefficients of thermal expansion is within ±50%. Also, being heat resistant to the approximately same degrees may mean that it does not melt at the step of annealing the processing target-laminate body 42 (S140).

The second protective film 32 may be thicker than the first protective film 30. In the present example, the thickness of the second protective film 32 is 200 nm, and the thickness of the first protective film 30 is 70 nm. By making the less crystallized second protective film 32 thicker than the first protective film 30, it is possible to prevent generation of cracks in the first protective film 30. Also, the physical strength of a protective film can be improved as compared with a case where the first protective film 30 is employed singly.

Also, by the first protective film 30 being pressed against with the second protective film 32, the degree of adhesion between the first protective film 30 and the front surface 14 can be improved as compared with a case where the first protective film 30 is employed singly. Furthermore, if a material that is more heat resistant than the first protective film 30 is used for the second protective film 32, the heat resistance of a protective film can be improved as compared with a case where the first protective film 30 is employed singly.

Although in the present example, an example in which p-type impurities are ion-implanted, in another example, n-type impurities may be ion-implanted into a predetermined region of the GaN layer 20. In this case also, the step of forming the first protective film 30 by ALD (S120), the step of forming the second protective film 32 (S125), and the step of annealing the processing target-laminate body 42 at a temperature of 1300° C. or higher (S130) in the present example may be applied.

Figure 7:
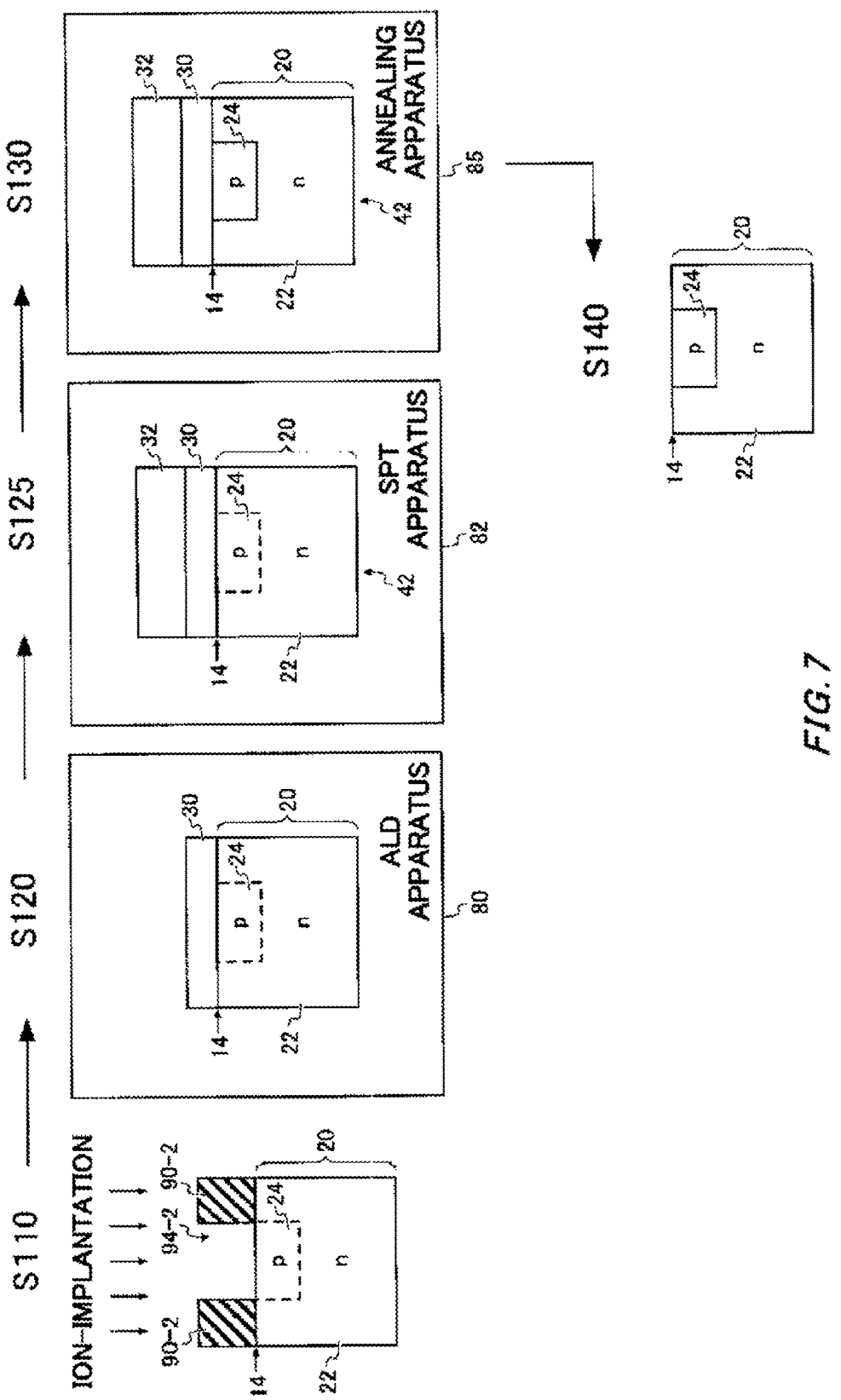
FIG. 7 is a figure showing S110 to S140 corresponding to respective steps of the manufacturing method 200.

FIG. 7 is a figure showing S110 to S140 corresponding to the respective steps of the manufacturing method 200. Because S110, S120 and S130 are similar to the steps in the first embodiment, they are not explained repeatedly. At S125 in the present example, the second protective film 32 is provided to the entire surface of the first protective film 30 on and in direct contact with the first protective film 30. The second protective film 32 may be formed using a sputtering apparatus (abbreviated to an SPT apparatus 82). Also, at S140 in the present example, because the first protective film 30 is an ALD-AlN film, and the second protective film 32 is an SPT-AlN film, they are both removed using KOHaq.

Figure 8A:
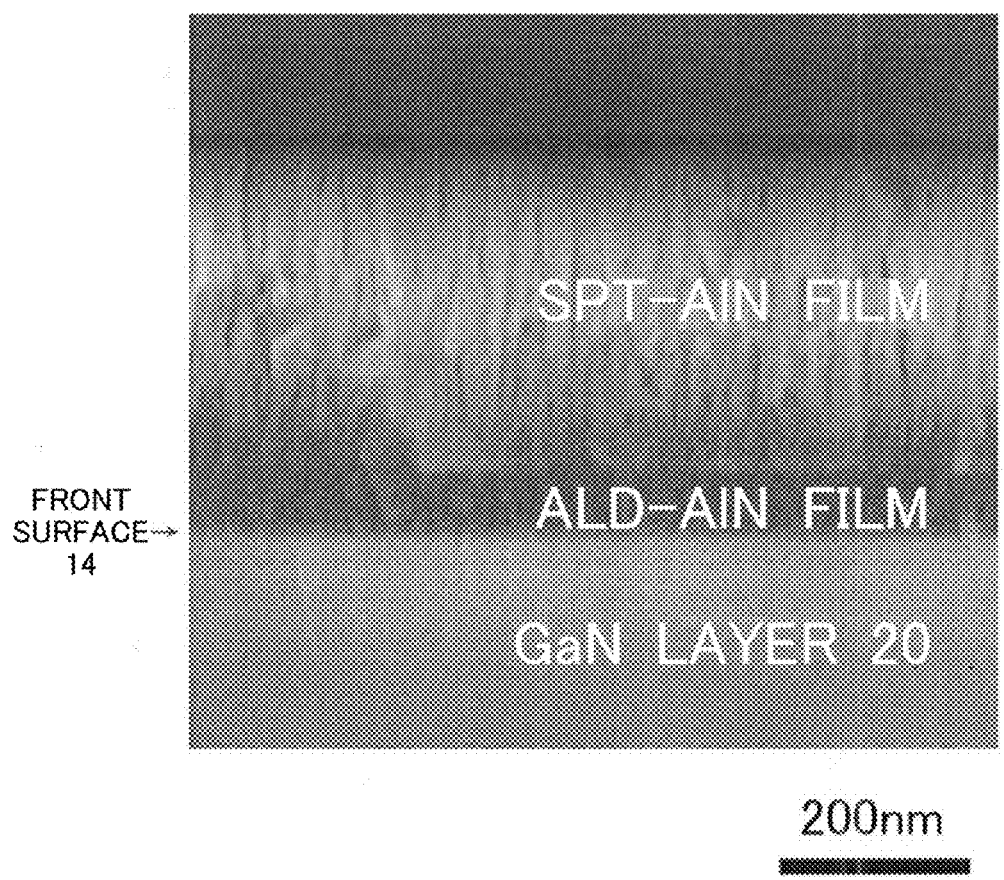
FIG. 8A is an SEM image showing a cross section of an ALD-AlN film and an SPT-AlN film on the GaN layer 20 obtained after annealing is performed at 1400° C. according to the second embodiment.

FIG. 8A is an SEM image showing a cross section of an ALD-AlN film and an SPT-AlN film on the GaN layer 20 obtained after annealing is performed at 1400° C. according to the second embodiment. As is obvious from FIG. 8A, there are no gaps between the ALD-AlN film as the first protective film 30 and the front surface 14 of the GaN layer 20 even after annealing is performed at 1400° C., and a good degree of adhesion is maintained.

Figure 8B:
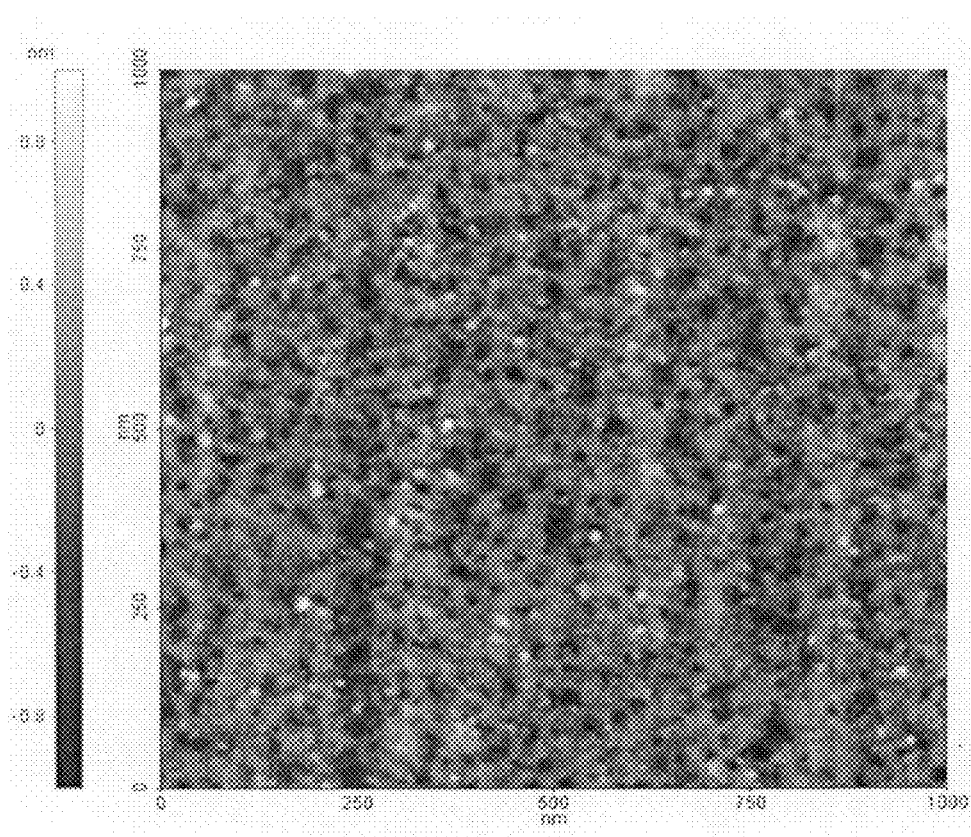
FIG. 8B is an AFM image showing a front surface 14 of the GaN layer 20 in a state where the ALD-AlN film and the SPT-AlN film have been removed after annealing is performed at 1400° C. according to the second embodiment.

FIG. 8B is an AFM image showing the front surface 14 of the GaN layer 20 in a state where the ALD-AlN film and the SPT-AlN film have been removed after annealing is performed at 1400° C. according to the second embodiment. The roughness Rrms of the front surface 14 was 0.233 nm. This value of Rrms is about a sixth of that in the third experimental example shown in FIG. 5 in which the annealing temperature was 1400° C. (an example in which gaps were generated). This made it obvious that it is advantageous to provide a laminate of the first protective film 30 and the second protective film 32 as protective films compared with the third experimental example in which only an SPT-AlN film was provided.

Figure 9:
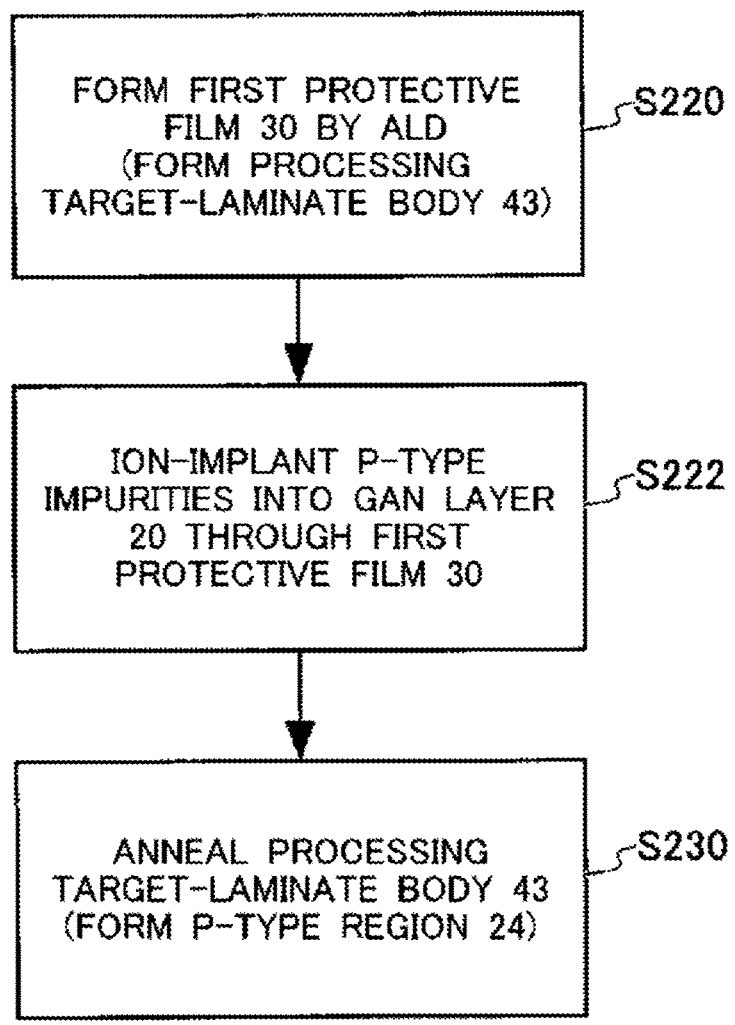
FIG. 9 is a figure showing a manufacturing method 300 to form the p-type region 24 in the GaN layer 20 according to a third embodiment.

FIG. 9 is a figure showing a manufacturing method 300 to form the p-type region 24 in the GaN layer 20 according to a third embodiment. In the present example, p-type impurities are ion-implanted into a predetermined region after the step of forming the first protective film 30 by ALD (S220). That is, in the present example, p-type impurities are through-doped into the GaN layer 20 through the first protective film 30. In the present specification, also, the superscript "+", if affixed to n or p, means a higher carrier concentration than if not affixed, and the superscript "−", if affixed to n or p, means a lower carrier concentration than if not affixed.

The manufacturing method 300 includes a step of forming the first protective film 30 (S220), a step of implanting p-type impurities through the first protective film 30 (S222), and a step of annealing a processing target-laminate body 43 having the first protective film 30 and the GaN layer 20 (S230). In the present example, the respective steps are executed in the order of S220, S222 and S230. Because S220 and S230 are the same as S120 and S130 in the second embodiment, they are not explained repeatedly.

Figure 10:
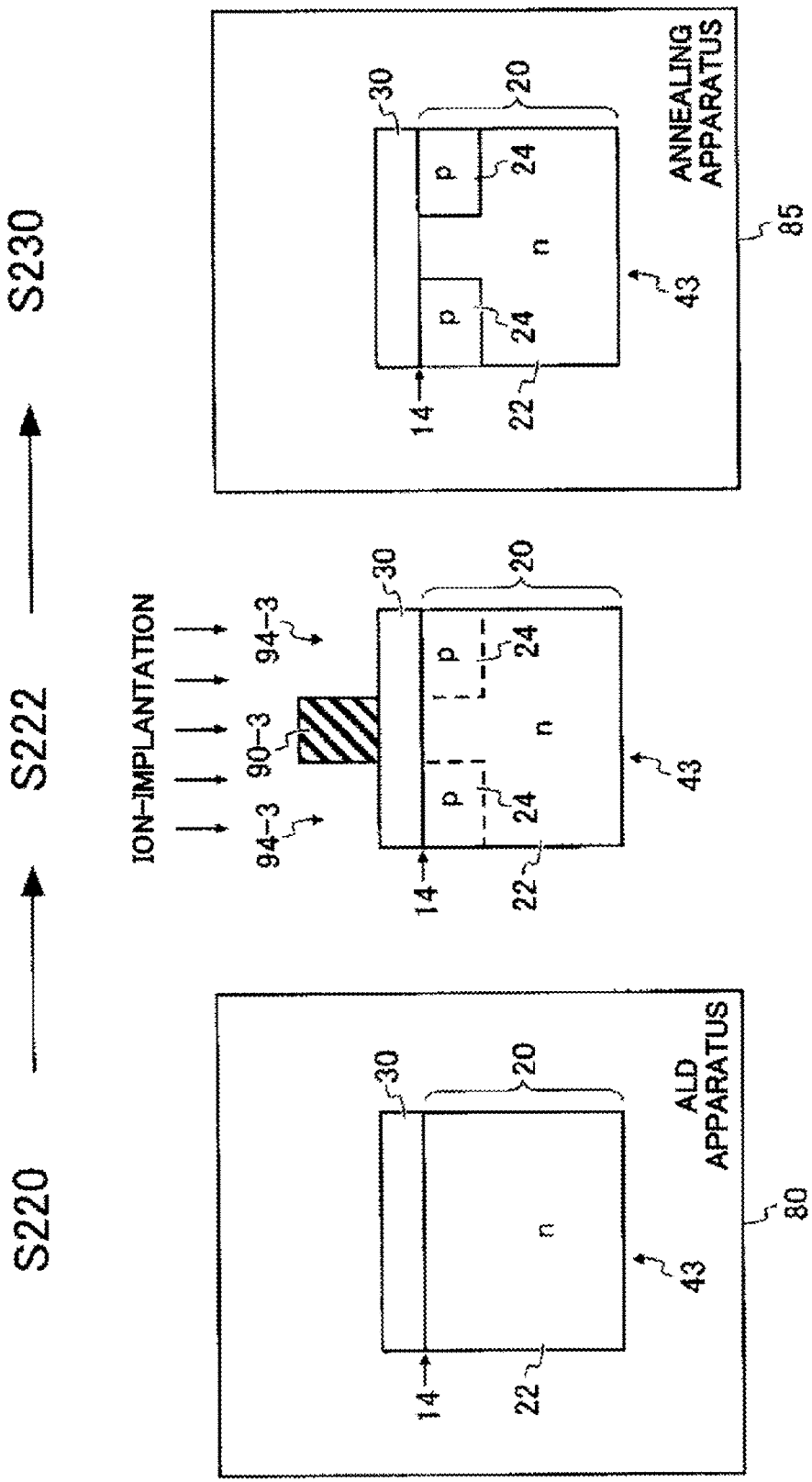
FIG. 10 is a figure showing S220 to S230 corresponding to respective steps of the manufacturing method 300.

FIG. 10 is a figure showing S220 to S230 corresponding to the respective steps of the manufacturing method 300. At S222, p-type impurities are ion-implanted into the n-type region 22 of the GaN layer 20 through a mask 90-3 and the first protective film 30. Thereby, the p-type region 24 is formed. In a similar manner to the second embodiment, the first protective film 30 is an ALD-AlN film.

Even if Al or N in the AN film is forced out due to ion implantation to be implanted into the GaN layer 20, p-type or n-type properties of the GaN layer 20 are not affected. Also, by using the first protective film 30 as a through-film, damages to the front surface 14 at the time of ion implantation can be reduced. Although the upper surface of the first protective film 30 used as the through-film (the surface opposite to the surface contacting the front surface 14) is roughened to some degree, the first protective film 30 can function as a protective film even if it is utilized as is at the annealing step (S230).

As a variant of the present example, a step of forming the second protective film 32 (S225) may further be provided between S222 and S230. S225 may be the same as S125 in second embodiment. Thereby, benefits of providing the second protective film 32 can be enjoyed.

Figure 11:
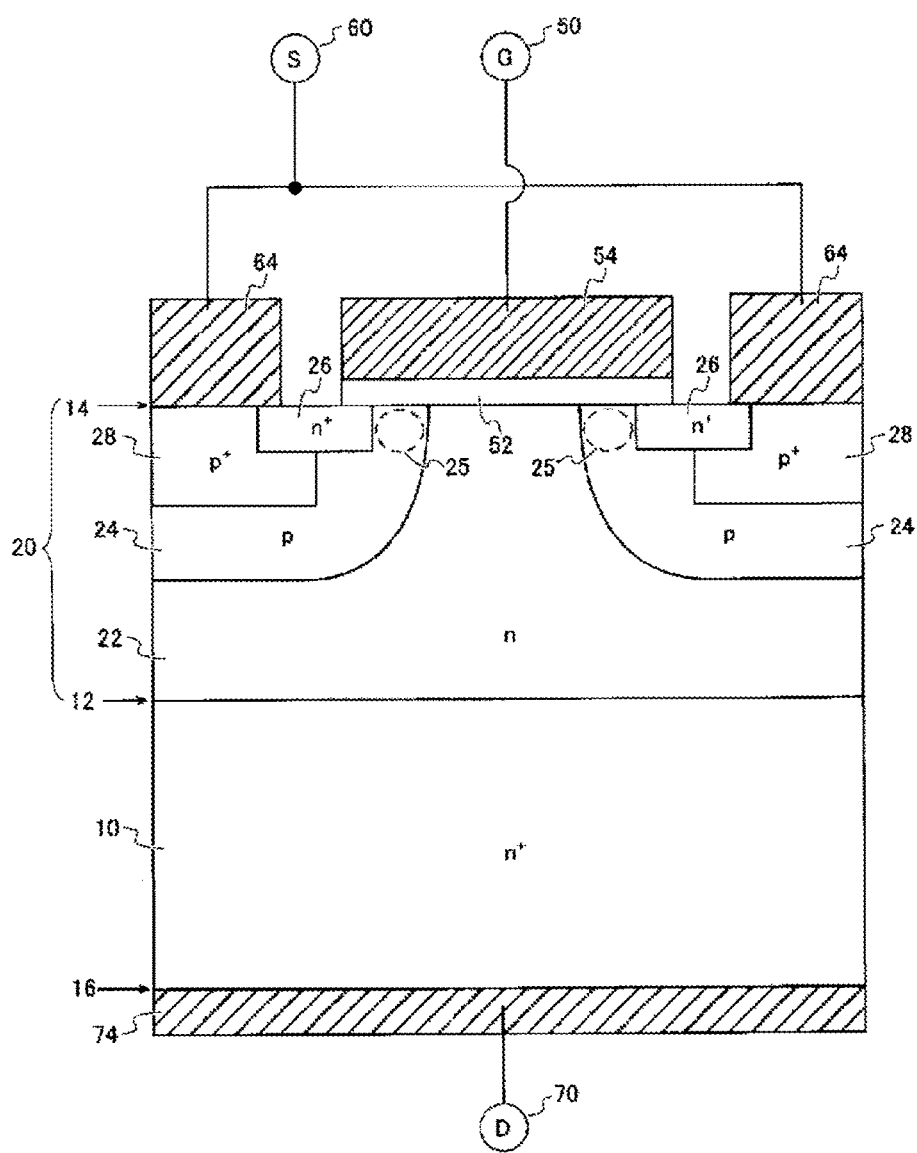
FIG. 11 is a schematic view showing a vertical MOSFET 400 according to a fourth embodiment.

FIG. 11 is a schematic view showing a vertical MOSFET 400 according to a fourth embodiment. In the present example, the vertical MOSFET 400 is formed by utilizing the first protective film 30. The vertical MOSFET 400 may have the function of switching between conduction and non-conduction of current.

The vertical MOSFET 400 in the present example has an n+-type GaN substrate 10, the GaN layer 20, a gate insulating film 52, a gate electrode 54, a source electrode 64 and a drain electrode 74. The GaN layer 20 is a homoepitaxial layer provided on and in direct contact with the GaN substrate 10. In a similar manner to the above-mentioned embodiments, the front surface 14 is one principal surface of the GaN layer 20. Also, a back surface 16 is a principal surface of the GaN substrate 10 not contacting the GaN layer 20. The boundary between the GaN substrate 10 and the GaN layer 20 is a boundary 12.

In the present example, the "upward" direction means the direction from the back surface 16 of the GaN substrate 10 to the front surface 14 of the GaN layer 20. Also, the "downward" direction means the direction opposite to the upward direction. The "upward" and "downward" directions do not necessarily mean vertical directions relative to the ground. The "upward" and "downward" directions are merely expressions that are used for the sake of convenience to specify relative positional relationship among layers, films and the like. The "upward" and "downward" directions in the present example may be analogically applied to the first to third embodiments.

The GaN layer 20 has an n-type region 22, a p-type region 24, an n+-type region 26 and a p+-type region 28. A region of the GaN layer 20 into which impurities have been implanted may be exposed to at least part of the front surface 14. In the present example, the region into which impurities have been implanted is the p-type region 24, the n+-type region 26 and the p+-type region 28 that are formed in a predetermined depth range from the front surface 14.

The n-type region 22 functions as a drift layer of the vertical MOSFET 400. A portion, in the p-type region 24, that is directly below the gate insulating film 52 and between the n-type region 22 and the n+-type region 26 functions as a channel formation region 25. The n+-type region 26 functions as a source region. The n+-type region 26 has the function of providing an electron passage path. The p+-type region 28 has the function of reducing a contact resistance relative to the source electrode 64, and the function of providing a hole extraction path at the time of turning off the vertical MOSFET 400.

The gate insulating film 52 is provided in direct contact at least with upper parts of the p-type region 24 and the n-type region 22. The gate electrode 54 is provided on and in direct contact with the gate insulating film 52. The source electrode 64 is provided electrically connected with the n+-type region 26 and the p+-type region 28. Also, the drain electrode 74 is provided in direct contact with the back surface 16 of the GaN substrate 10.

A gate terminal 50, a source terminal 60 and a drain terminal 70 are denoted with G, D and S in circles, respectively. For example, if in a case where the drain electrode 74 has a predetermined high potential and the source electrode 64 has the ground potential, if a potential with a threshold voltage or a voltage higher than that is applied from the gate terminal 50 to the gate electrode 54, a charge inverted layer is formed in the channel formation region 25, and current flows from the drain terminal 70 to the source terminal 60. Also, if a potential with a voltage lower than a threshold voltage is applied to the gate electrode 54, a charge inverted layer in the channel formation region 25 disappears, and current is blocked.

Figure 12:
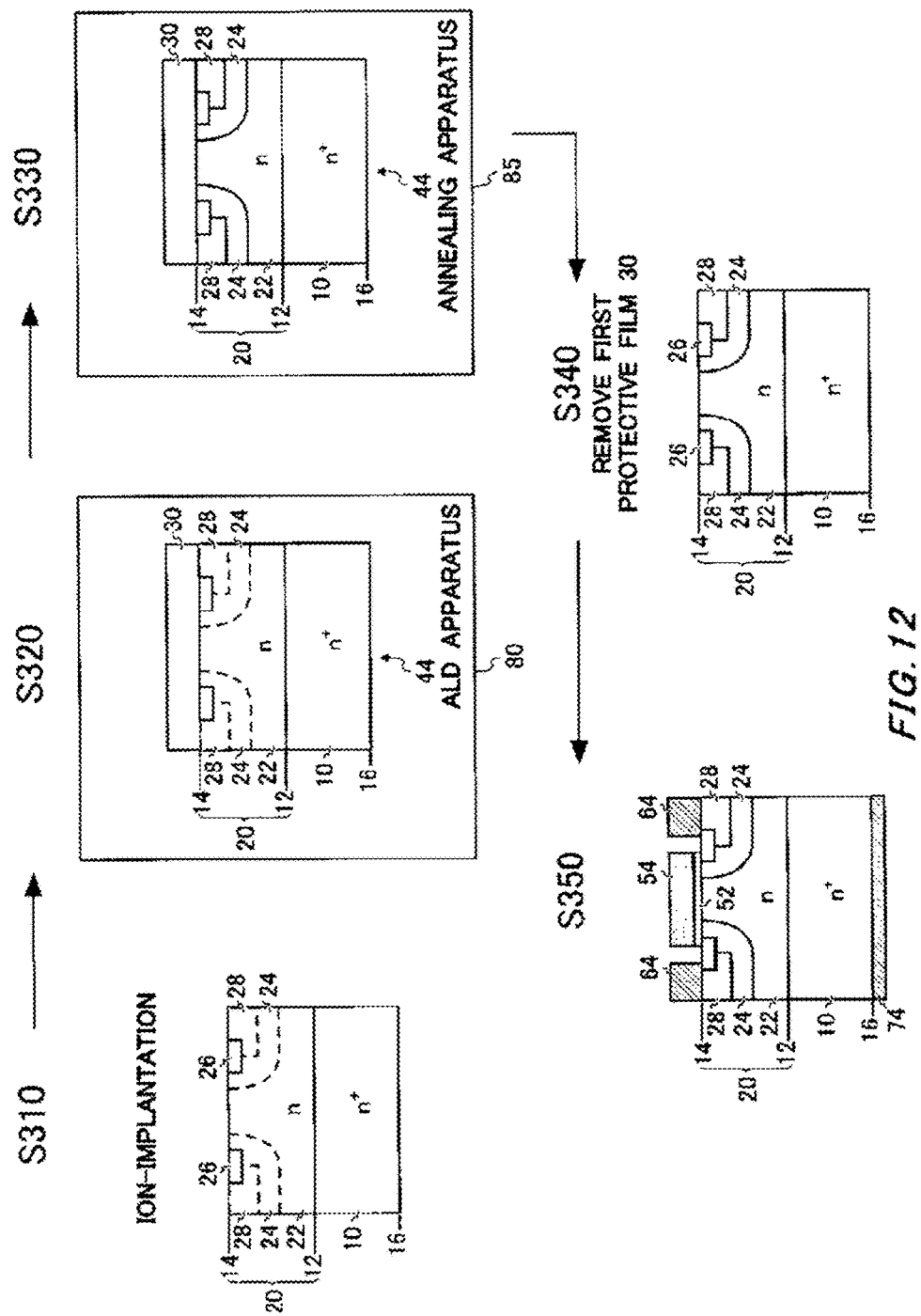
FIG. 12 is a figure showing S310 to S350 corresponding to a method of manufacturing the vertical MOSFET 400.

FIG. 12 is a figure showing S310 to S350 corresponding to a method of manufacturing the vertical MOSFET 400. S310 is a step of ion-implanting n-type and p-type impurities into the GaN layer 20 epitaxially formed on the GaN substrate 10. S320 is a step of forming the first protective film 30 on the front surface 14 of the GaN layer 20. S330 is a step of annealing a processing target-laminate body 44 having the GaN substrate 10, the GaN layer 20 and the first protective film 30. S340 is a step of removing the first protective film 30. S350 is a step of forming the gate insulating film 52, the gate electrode 54, the source electrode 64 and the drain electrode 74.

The GaN layer 20 may be formed epitaxially by MOCVD on the self-supporting GaN substrate 10 that has a threading dislocation density of $10^7$ cm$^{-2}$ or lower. At S310, n-type and p-type impurities may be ion-implanted using the mask 90 in a similar manner to S10 and S110. Although only the first protective film 30 is used at S320 in the present example, a protective film formed by lamination of the first protective film 30 and the second protective film 32 may be used in a similar manner to the second embodiment. S330 is the same as S30, S130 and S230. S340 is the same as S40, S140 and S240.

At S350, the gate insulating film 52 may be an SiO$_2$ film, and the gate electrode 54 may be polycrystalline silicon. The source electrode 64 may be a laminate body having: an underlying Ti (titanium) layer that is in direct contact with the front surface 14; and an overlying Al layer. The drain electrode 74 may be a laminate body having: an overlying Ti layer that is in direct contact with the back surface 16 of the GaN substrate 10; and an underlying Al layer. After S350, the gate terminal 50, the source terminal 60 and the drain terminal 70, and the gate electrode 54, the source electrode 64 and the drain electrode 74 are connected by wiring, respectively. Thereby, the vertical MOSFET 400 is completed.

Figure 13:
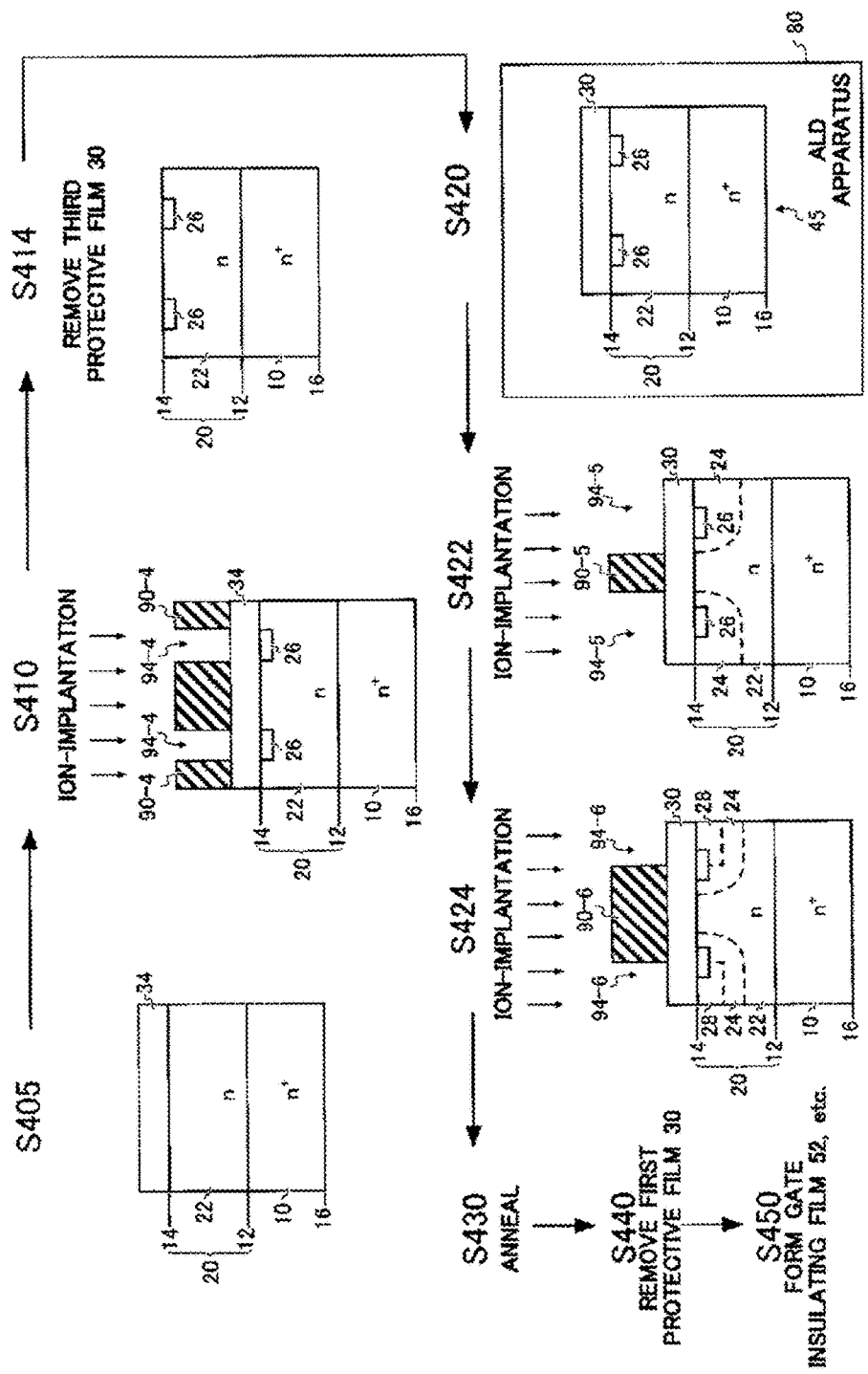
FIG. 13 is a figure showing S405 to S450 corresponding to a method of manufacturing the vertical MOSFET 400 according to a fifth embodiment.

FIG. 13 is a figure showing S405 to S450 corresponding to a method of manufacturing the vertical MOSFET 400 according to a fifth embodiment. The present example is different from the fourth embodiment in that through-dope is performed through a third protective film 34. It may be the same as the fourth embodiment in other respects. In the present example, the respective steps are executed in the order of S405 to S450.

S405 is a step of forming the third protective film 34 on and in direct contact with the front surface 14 of the GaN layer 20. The third protective film 34 may contain one or more types among silicon (Si) and oxygen (O). The third protective film 34 in the present example is silicon dioxide (SiO$_2$). The third protective film 34 in the present example is provided in direct contact with the entire surface of the front surface 14. However, the third protective film 34 only has to be provided on and in direct contact with at least the n+-type region 26.

The third protective film 34 is provided for a purpose that is different from the purposes of the first protective film 30 and the second protective film 32. In the present example, the third protective film 34 is provided in order to reduce damages to the front surface 14 at the time of ion implantation. Therefore, the third protective film 34 is removed at the time of annealing. The third protective film 34 may have a thickness of several nms or larger and smaller than 1 µm. The third protective film 34 in the present example has a thickness of 20 nm.

S410 is a step of ion-implanting n-type impurities through the mask 90-4 and the third protective film 34. Thereby, the n+-type region 26 is formed in another predetermined region corresponding to the shape of the opening 94-4.

S414 is a step of removing the third protective film 34. S420 is a step of forming the first protective film 30 by ALD.

Thereby, a processing target-laminate body 45 having the GaN substrate 10, the GaN layer 20 and the first protective film 30 is formed.

S422 is a step of ion-implanting p-type impurities into the GaN layer 20 and forming the p-type region 24 using the first protective film 30 as a through-film in a similar manner to S322 in the third embodiment. S424 is a step of ion-implanting p-type impurities into the GaN layer 20 and forming the p+-type region 28 using the first protective film 30 as a through-film.

After S424, the mask 90-6 is removed. Thereafter, the processing target-laminate body 45 is annealed at S430. The annealing of the processing target-laminate body 45 is similar to S30, S130, S230 and S330. After the mask 90-6 is removed and before the processing target-laminate body 45 is annealed, the second protective film 32 may further be provided on the first protective film 30. That is, S125 in the second embodiment may be applied. Thereby, benefits of providing the second protective film 32 may be enjoyed also in the present example.

After S430, the first protective film 30 is removed at S440. S440 is similar to S340. At S450, the gate insulating film 52 and the like are formed. S450 is similar to S350. Illustration of S430, S440 and S450 are omitted.

Figure 14:
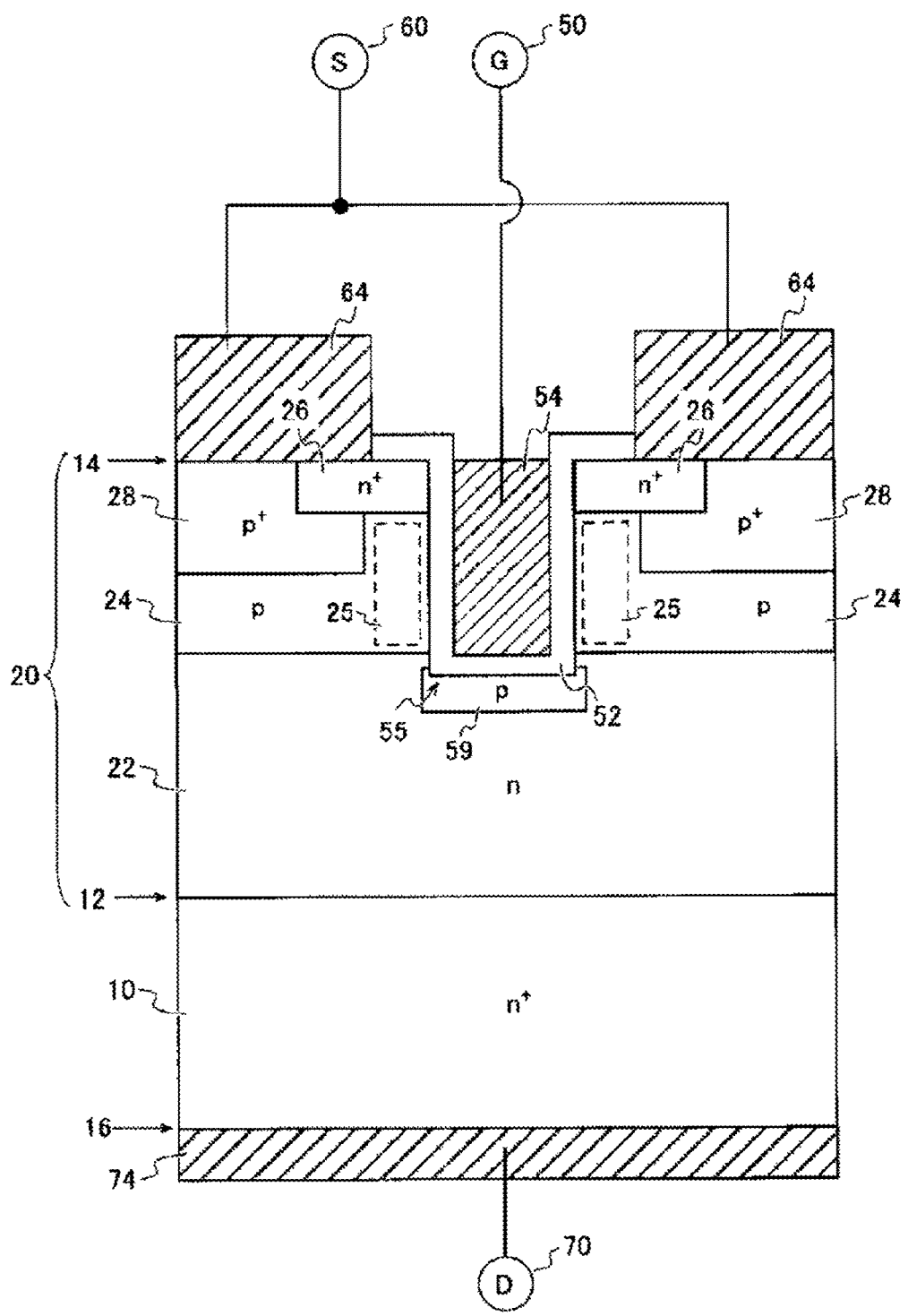
FIG. 14 is a schematic view showing a vertical MOSFET 600 according to a sixth embodiment.

FIG. 14 is a schematic view showing a vertical MOSFET 600 according to a sixth embodiment. The GaN layer 20 of the vertical MOSFET 600 in the present example has a trench 55 to which the gate insulating film 52 and the gate electrode 54 are provided. Also, a p-type region 59 is provided to a bottom portion 56 of the trench 55 by ion implantation. The vertical MOSFET 600 is different from the vertical MOSFET 400 in the fourth and fifth embodiments in these respects.

Figure 15:
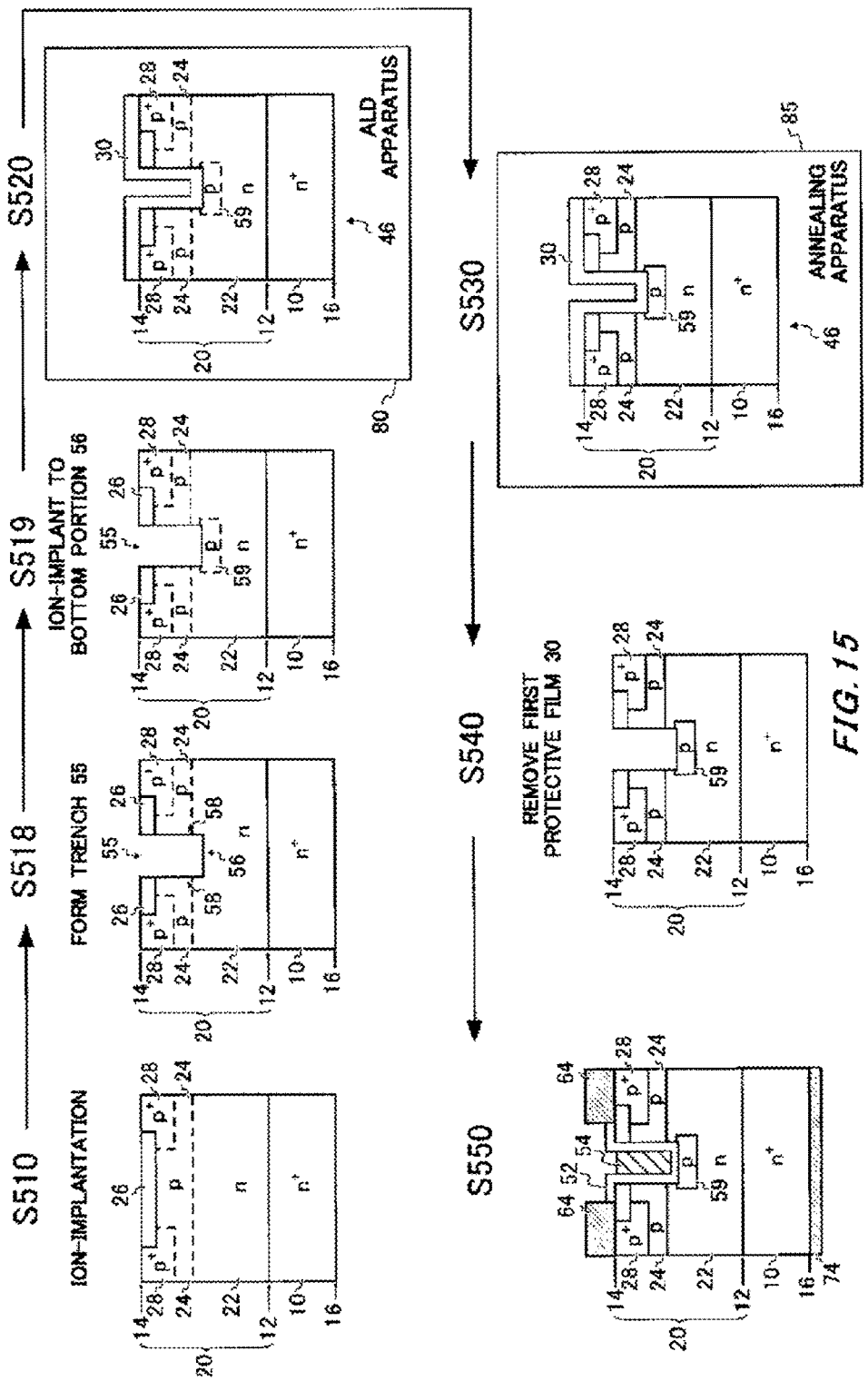
FIG. 15 is a figure showing S510 to S550 corresponding to a method of manufacturing the vertical MOSFET 600.

FIG. 15 is a figure showing S510 to S550 corresponding to a method of manufacturing the vertical MOSFET 600. The present example is different from the fourth and fifth embodiments in that the p-type region 59 is provided to the bottom portion 56 of the trench 55 by ion implantation and that the first protective film 30 is provided to the trench 55. It may be the same as the fourth and fifth embodiments in other respects. In the present example, the respective steps are executed in the order of S510 to S550.

S510 is a step of forming the p-type region 24, the n+-type region 26 and the p+-type region 28 by ion implantation. At S510, through-dope through the first protective film 30 may be applied in a similar manner to S222 in the third embodiment and S422 in the fifth embodiment. Also, at S510, through-dope through the third protective film 34 may be applied in a similar manner to S410 in the fifth embodiment. S518 is shown in the figure as a step of forming the trench 55 penetrating the p-type region 24 by performing anisotropic dry etching on the GaN layer 20.

S519 is a step of providing the p-type region 59 to the bottom portion 56 of the trench 55 by ion implantation. The p-type region 59 is activated at the step of annealing (S530). Thereby, the p-type region 59 has the function of suppressing concentration of electric field at a corner portion of the bottom portion 56 of the trench 55 (that is, the boundary portion between the bottom portion 56 and the side portion 58). Thereby, deterioration of the gate insulating film 52 can be suppressed.

S520 is a step of providing the first protective film 30 so as to coat the front surface 14, and the bottom portion 56 and the side portion 58 of the trench 55. Thereby, a processing target-laminate body 46 having the GaN substrate 10, the GaN layer 20 and the first protective film 30 is formed. Because the first protective film 30 in the present example also is an ALD-AlN film, the trench 55 can be surely coated as compared with SPT and MOCVD. The second protective film 32 may further be provided on the first protective film 30. That is, S125 in the second embodiment may be applied. Thereby, in the present example also, benefits of providing the second protective film 32 can be enjoyed.

S530 is a step of annealing the processing target-laminate body 46. S540 is a step of removing the first protective film 30. S550 is a step of forming the gate insulating film 52 and the like. Because these are the same as S330, S340 and S350 in the fourth embodiment respectively, they are not explained repeatedly.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: GaN substrate; 12: boundary; 14: front surface; 16: back surface; 20: GaN layer; 22: n-type region; 24: p-type region; 25: channel formation region; 26: n+-type region; 28: p+-type region; 30: first protective film; 32: second protective film; 34: third protective film; 41: processing target-laminate body; 42: processing target-laminate body; 43: processing target-laminate body; 44: processing target-laminate body; 45: processing target-laminate body; 46: processing target-laminate body; 50: gate terminal; 52: gate insulating film; 54: gate electrode; 55: trench; 56: bottom portion; 58: side portion; 59: p-type region; 60: source terminal; 64: source electrode; 70: drain terminal; 74: drain electrode; 80: ALD apparatus; 82: SPT apparatus; 85: annealing apparatus; 90: mask; 94: opening; 100: manufacturing method; 200: manufacturing method; 300: manufacturing method; 400: vertical MOSFET; 600: vertical MOSFET

What is claimed is:

1. A semiconductor device manufacturing method of manufacturing a semiconductor device having a nitride semiconductor layer, the semiconductor device manufacturing method comprising:

implanting, into a predetermined region of the nitride semiconductor layer, n-type or p-type impurities relative to the nitride semiconductor layer;

forming, by atomic layer deposition, a first protective film containing a nitride on and in direct contact with at least the predetermined region; and annealing the nitride semiconductor layer and the first protective film at a temperature of 1300° C. or higher, wherein the implanting has implanting n-type impurities relative to the nitride semiconductor layer into another predetermined region of the nitride semiconductor layer before the implanting the p-type impurities into the predetermined region, the semiconductor device manufacturing method further comprises, before the implanting the n-type impurities, forming a third protective film that is on and in direct contact with the other predetermined region and contains one or more types among silicon and oxygen, and the first protective film is formed by the atomic layer deposition after removing the third protective film.

2. The semiconductor device manufacturing method according to claim 1, wherein the forming the first protective film by the atomic layer deposition has forming the first protective film having an aluminium nitride or a silicon nitride by supplying, onto the nitride semiconductor layer, an aluminium atom-containing gas or a silicon atom-containing gas and a nitrogen atom-containing gas alternately.

3. The semiconductor device manufacturing method according to claim 1, wherein in the forming the first protective film by the atomic layer deposition, a temperature of the nitride semiconductor layer is 600° C. or lower.

4. The semiconductor device manufacturing method according to claim 1, wherein in the forming the first protective film by the atomic layer deposition, a temperature of the nitride semiconductor layer is 300° C. or higher.

5. The semiconductor device manufacturing method according to claim 1, wherein the first protective film has a thickness of 2 nm or larger and 100 nm or smaller.

6. The semiconductor device manufacturing method according to claim 1, wherein the forming the first protective film by the atomic layer deposition has:
   (a) supplying trimethylaluminium onto the nitride semiconductor layer;
   (b) evacuating a reaction chamber in which the nitride semiconductor layer is placed;
   (c) irradiating the nitride semiconductor layer with plasma of a nitrogen-containing gas; and
   (d) evacuating the reaction chamber, and
   one cycle including (a) to (d) is repeated multiple times to form the first protective film.

7. The semiconductor device manufacturing method according to claim 1, wherein
   the nitride semiconductor layer has a trench to which a gate insulating film and a gate electrode are provided, and
   the first protective film is provided coating a bottom portion and a side portion of the trench.

8. The semiconductor device manufacturing method according to claim 1, wherein the implanting has implanting the p-type impurities into the predetermined region after the forming the first protective film by the atomic layer deposition.

9. A semiconductor device manufacturing method of manufacturing a semiconductor device having a nitride semiconductor layer, the semiconductor device manufacturing method comprising:
   implanting, into a predetermined region of the nitride semiconductor layer, n-type or p-type impurities relative to the nitride semiconductor layer;
   forming, by a first type of method, a first protective film containing a nitride on and in direct contact with at least the predetermined region;
   forming a second protective film on and in direct contact with the first protective film by a second type of method different from the first type of method; and annealing the nitride semiconductor layer, the first protective film and the second protective film at a temperature of 1300° C. or higher, wherein
   the implanting has implanting n-type impurities relative to the nitride semiconductor layer into another predetermined region of the nitride semiconductor layer before the implanting the p-type impurities into the predetermined region,
   the semiconductor device manufacturing method further comprises, before the implanting the n-type impurities, forming a third protective film that is on and in direct contact with the other predetermined region and contains one or more types among silicon and oxygen, and
   the first protective film is formed by the atomic layer deposition after removing the third protective film.

10. The semiconductor device manufacturing method according to claim 9, wherein the first type of method is atomic layer deposition.

11. The semiconductor device manufacturing method according to claim 10, wherein the second type of method is sputtering.

12. The semiconductor device manufacturing method according to claim 11, wherein a material of the first protective film is the same as a material of the second protective film.

13. The semiconductor device manufacturing method according to claim 9, wherein a material of the first protective film is the same as a material of the second protective film.

* * * * *